United States Patent
De Graauw

(10) Patent No.: US 6,819,293 B2
(45) Date of Patent: Nov. 16, 2004

(54) PATCH ANTENNA WITH SWITCHABLE REACTIVE COMPONENTS FOR MULTIPLE FREQUENCY USE IN MOBILE COMMUNICATIONS

(75) Inventor: Antonius Johannes Matheus De Graauw, Nijimegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/467,739

(22) PCT Filed: Feb. 13, 2002

(86) PCT No.: PCT/IB02/00440

§ 371 (c)(1),
(2), (4) Date: Aug. 13, 2003

(87) PCT Pub. No.: WO02/067375

PCT Pub. Date: Aug. 29, 2002

(65) Prior Publication Data

US 2004/0066336 A1 Apr. 8, 2004

(30) Foreign Application Priority Data

Feb. 13, 2002 (EP) .............................................. 01200502

(51) Int. Cl.[7] .................................................. H01Q 1/24
(52) U.S. Cl. ................................ 343/702; 343/700 MS; 343/850

(58) Field of Search .......................... 343/700 MS, 702, 343/850, 852, 860

(56) References Cited

U.S. PATENT DOCUMENTS

| | | | |
|---|---|---|---|
| 6,166,694 A | * | 12/2000 | Ying .......................... 343/702 |
| 6,255,994 B1 | * | 7/2001 | Saito ................... 343/700 MS |
| 6,323,811 B1 | * | 11/2001 | Tsubaki et al. ...... 343/700 MS |
| 6,326,927 B1 | * | 12/2001 | Johnson et al. ............. 343/702 |
| 6,353,443 B1 | * | 3/2002 | Ying .......................... 345/702 |

FOREIGN PATENT DOCUMENTS

| | | | |
|---|---|---|---|
| EP | 0884796 | 12/1998 | ............ H01Q/1/36 |
| WO | WO0003453 | 1/2000 | ............ H01Q/1/24 |

OTHER PUBLICATIONS

GB000065, U.S. patent application Ser. No. s 09/864131, Filing Date: May 24, 2001.

* cited by examiner

*Primary Examiner*—Tho Phan
(74) *Attorney, Agent, or Firm*—Aaron Waxler

(57) ABSTRACT

The apparatus (100) comprises a printed circuit board (20) on which an antenna device (10) is present. The antenna (2) of the antenna device (10) can be tuned by means of matching bridges (34, 37), each of which comprise a reactive component (3,4) and a switch (25, 26). Preferably, the switches (25,26) are located outside the antenna device (10) such that a standardized antenna device (10) can be used.

12 Claims, 3 Drawing Sheets

PATCH ANTENNA WITH SWITCHABLE REACTIVE COMPONENTS FOR MULTIPLE FREQUENCY USE IN MOBILE COMMUNICATIONS

The invention relates to an apparatus with a radio communication function, comprising a carrier having a first and an opposite, second side and provided with a ground conductor, at which first side an antenna device is present, which antenna device comprises a substrate having a first and an opposite, second side and an antenna present at the first side of the substrate and having an input impedance, the apparatus further comprising means for tuning said input impedance.

The invention also relates to an antenna device.

The invention further relates to a carrier having a first and an opposite, second side and provided with a ground conductor.

The invention also to a method of tuning an antenna of an apparatus with a radio communication function, which apparatus comprises a carrier with a ground conductor and an antenna device comprising a substrate and the antenna, which method comprises the steps of measuring an input impedance and adapting the input impedance.

Such an apparatus, such an antenna device and such a method are known from WO-A 00/03453. The known antenna is of the PIFA type and substantially consists of a metal strip. The metal strip of the known antenna device is provided with ground terminal and an input terminal. Between said terminal a matching bridge is present. Tuning of the antenna is performed by measuring or estimating the input impedance associated with the antenna and subsequently matching the input impedance through adjustment of the length of the matching bridge. Tuning of the antenna is necessary for each specific application, i.e. each apparatus with its own design.

It is a disadvantage of the known antenna device that it must be modified for each application. This precludes the use of standardized antenna devices.

It is therefore a first object of the invention to provide an apparatus of the kind mentioned in the opening paragraph of which the antenna can be tuned without significant modification of the antenna device.

It is a second object of the invention to provide an antenna device of the kind mentioned in the opening paragraph which can be used in various applications without any further substantial modifications.

It is a third object of the invention to provide a carrier that can be used in the apparatus of the invention.

It is a fourth object of the invention to provide a method of the kind mentioned in the opening paragraph, by which the antenna can be tuned without significant modification of the antenna device.

The first object is achieved in that said means comprise a first and a second matching bridge that comprise a reactive component and a switch, and that are connected between the antenna and the ground conductor. In the present invention, the input impedance is adjusted by switching at least one of the switches on or off. Due to the inclusion of the switch in each of the matching bridges, the matching of the input impedance is converted from an analogue into a digital operation. Although the number of matching bridges can be relatively small, the resulting tuning is sufficiently good. Furthermore, the inclusion of the switch in each of the matching bridges allows the provision of the switch in a different location than the reactive component. In particular the switch is provided in a location, where it is well accessible after the antenna device has been placed on the carrier, for instance a printed circuit board. Such location are, for example, an outer surface of the printed circuit board and an outer surface of the antenna device.

If the reactive components are capacitors, the matching bridges are connected in parallel. The matching bridges with capacitors can be attached to the antenna in any location, but preferably are attached to one end of the antenna, whereas a ground terminal connecting the antenna to ground is present at another end of the antenna. If the antenna is of the patch or PIFA type, the capacitors preferably comprise a dielectric material with a relatively high dielectric constant. Capacitors with a dielectric constant of about 80 relative to vacuum and with a good temperature stability of the capacitance are commercially available. If the reactive components are inductors, they are preferably connected in series, whereas the switches of the matching bridges are connected in parallel.

In a preferred embodiment, the reactive components of the first and second matching bridges are capacitors, and the matching bridges are connected in parallel. This has the advantage that the input impedance can be tuned over a relatively broad range. If, for example, a first, a second and a third matching bridge are present and—as is preferable— the reactive components each have a different value, the input impedance can be adjusted to eight different values.

In a further preferred embodiment, a resonant circuit is connected between the antenna and the ground conductor. It has been observed that the presence of a resonant circuit provides a greater bandwidth. An advantage of this is that less tuning is necessary. Another advantage is that the combined presence of a greater bandwidth and the matching bridges allows the matching bridges to be used for fine-tuning. The reactive components may be chosen accordingly. A further advantage is that due to the connection of the resonant circuit the behavior of the antenna is modified so as to provide a dual band operation without the need for switching. Such is known from the non-prepublished application with number GB0013156.5 (PHGB000065).

The matching bridges may be present at the carrier, from where they are connected to one point on the antenna. Alternatively, the matching bridges may be present at the antenna device and are connected to the ground conductor through a single connection to the printed circuit board. Furthermore, an extension of the ground conductor may be present in the antenna device, for example in the substrate. It is preferable however that a first module contact pad forming part of the first matching bridge and a second module contact pad forming part of the second matching bridge are present at the second side of the substrate; and that a first board contact pad forming part of the first matching bridge and a second board contact pad forming part of the second matching bridge are present at the first side of the carrier. In this embodiment, connections to the ground conductor at the carrier are individualized. An advantage of this embodiment is that a standardized antenna device can be used for many applications. Said contact pads are preferably part of Ball Grid Arrays or Land Grid Arrays, so that a board contact pad and a complementary module contact pad are connected without an additional manufacturing step.

Any component with which the matching bridge can be disconnected or connected at least once may be used a switch. Electrically driven switches such as micro-electromechanical switches, actuators and transistors may be used. The switches may also be embodied so as to be remotely controlled, for example in response to a radio wave receiving state. In this embodiment, the remote, controlling part of the switch is easily accessible, whereas the actual switching part is provided anywhere in- or outside the antenna device. Furthermore, the switch may be embodied as a track, for example a track of which the conductivity can be changed with laser radiation. This track may contain a material having an amorphous and a crystalline state, such as the material aluminum-germanium.

In an advantageous embodiment, the switch substantially consists of a conductive track that can be cut through mechanically, optically or—as a fuse—electrically. Such a switch may be integrated in the pattern of conductive tracks at an outer surface of the carrier. Dimensions of the conductive track acting as a switch will depend on the application and the way of disconnecting. In an alternative embodiment, the switch consists of a pair of component pads at the carrier. By placing an SMD-component with a minimal resistance onto said component pads, a matching bridge is electrically connected to the printed circuit board. The apparatus according to claim 9 is provided as a result of such a once-only switchable switch.

In a preferred embodiment, the switches of the matching bridges are present on the first side of the carrier and located such that there is a zero overlap between a perpendicular projection of the antenna device onto the printed circuit board and the switches. The carrier is for instance a printed circuit board, but can be any other type of substrate, such as a multilayer ceramic substrate. A first advantage of the embodiment is that the carrier has a surface that is well accessible for the major part. A manufacturer of the apparatus of the invention can adjust the input impedance of the antenna by modifying the printed circuit board. A second advantage is that the matching bridges can be used by an antenna designer as additional means for providing an excellent antenna, next to the modification of the metal strip of the antenna and the location of terminals at the antenna.

In another embodiment, the switches of the matching bridges are present at the second side of the carrier, and a via is present between the switch and the board contact pad within each of the matching bridges. As the switches are present at the second side of the carrier, the surface of the carrier can be used in a very efficient manner, or it can be miniaturized. In this embodiment, the switches may also be used as the only means, or alternatively as additional means for tuning of the antenna. In this embodiment it is preferable that the ground conductor is also present at the second side of the carrier.

In a further embodiment, the reactive components are present in the antenna device. An advantage of this embodiment is that the manufacturer of the carrier, esp. the printed circuit board, does not need to understand the matching of the impedance; device the reactive components and their impedances are chosen in the design of the antenna. The reactive components may be implemented as discrete components, or may alternatively be integrated into an array of passive components or into the substrate—for example in a Low Temperature Co-fired Ceramic or LTCC substrate.

In a still further embodiment, the reactive components are integrated into an array of passive components. The integration of the reactive components leads to miniaturisation and to a reduction in assembly cost. Alternatively, the replacement of discrete components with an array offers the possibility to increase the number of reactive components, and hence to improve the tuning of the antenna. Furthermore, the reactive components in an array can be easily interconnected, thus providing the option of matching bridges with more than one reactive component. In comparison with the integration of reactive components in the substrate, it is the advantage of an array that a dielectric material with a high dielectric constant can be used for the capacitors and that the components have a very high precision.

In an advantageous embodiment, the antenna device comprises an integrated circuit and a number of passive components. An example of such an antenna device is a radio module suitable for communication according to the Bluetooth™ standard. The passive components present are, for example, a balun, a bandpass filter, a VCO resonator. The integrated circuit, for example, implemented as a transceiver. As the antenna device of this embodiment already comprises passive components, the introduction of the reactive components of the matching bridges does not give rise to additional process steps in the manufacture of the device. It further offers ample possibilities to integrate several individual reactive components into passive networks. Furthermore, said antenna device can be considered to be a true plug-and-play device and is suitable for various apparatuses such as telecellular phones, laptop computers, personal digital assistants, and other electronic consumer devices.

The second object is realized in an antenna device suitable for use in the apparatus as claimed in to any of the claims 1 to 8.

It is advantageous especially for a complex antenna device comprising an integrated circuit and a number of passive components that it can be manufactured in a standardized manner, and that any modification necessary for tuning the antenna is embodied outside the antenna device.

The third object is realized in a carrier suitable for use in the apparatus as claimed in to any of the claims 2 to 8, having a first and an opposite, second side and provided with a ground conductor, at which first side a first and a second board contact pad are present, which first and second contact pads are connected to the ground conductor via a first and a second switch, respectively.

The fourth object of the invention to provide a method of the kind mentioned in the opening paragraph, by which the antenna can be tuned without significant modification of the antenna device, is realized in that a first and a second matching bridge are present between at least one point on the antenna and at least one point on the ground conductor, each of said matching bridges comprising a reactive component and a switch, and in that the input impedance of the antenna is adapted through switching on or off at least one of said switches.

These and other aspects of the apparatus, the antenna device and the method according to the invention will be further elucidated with reference to the figures, in which.

Figure 1:
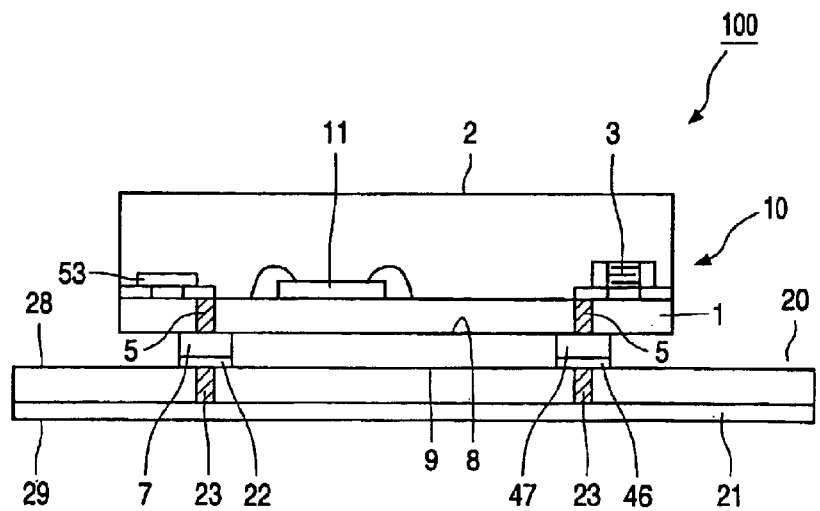
FIG. 1 is a cross-section al view of a first embodiment of the apparatus.
Figure 2:
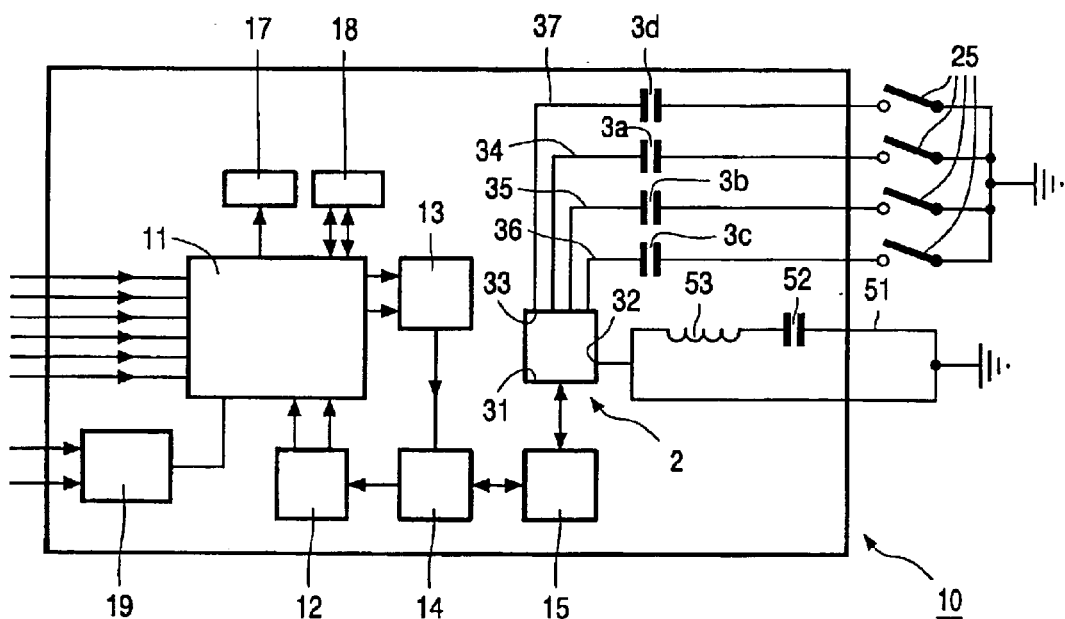
FIG. 2 is a block diagram of the first embodiment of the apparatus.

FIG. 1 shows a first embodiment of the apparatus 100 of the invention. The apparatus 10 comprises a printed circuit board 20 with a first side 28 and a second side 29. The printed circuit board 20 comprises a ground conductor 21 at its second side 29. An antenna device 10 is provided on the first side 28 of the printed circuit board 20. The antenna device 10 comprises a substrate 1 with a first side 8 and with an opposite, second side 9. On the first side 8 of the substrate 1 are provided an patch antenna 2, an integrated circuit 11, and reactive components 3,4. In this embodiment, the patch antenna 2 is U-shaped and is connected to the substrate 1 by two opposite side faces 91, 92. Alternatively, a construction may be used wherein the patch antenna 2 is connected to the substrate 1 at one side face only. Preferably, the antenna device 10 comprises further components as indicated in FIG. 2. The antenna 2 can be connected to the ground conductor 21 via the reactive components 3,4. For this purpose there are electrically conducting connections from each of the reactive components 3,4 to a number of switches 25, 26 which are present at the second side 29 of the printed circuit board 20. Each of the connections comprises a via 5 through the substrate 1 of the antenna device 10, a module contact pad 7, 47, a board contact pad 22, 46, and a via 23 through the printed circuit board 20.

FIG. 2 is a block diagram of the antenna device 10 according to the first embodiment of the apparatus 100 of the invention. The antenna device comprises an integrated circuit 11 provided with six input terminals 19. The integrated circuit functions as a transceiver. Coupled to the integrated circuit 11 are a VCO tank 16, a PLL loop filter 17, and a supply decoupling unit 18. The transceiver can transmit signals to the antenna 2 and receive signals from the antenna 2. A TX/RX switch 14 is provided or changing from the receiving to the transmitting function and vice versa. The TX/RX switch 14 directs signals via the RX balun filter 12 to the integrated circuit 11. The signals transmitted from the integrated circuit 11 go via the TX balun filter 13, the TX/RX switch 14, and a bandpass filter 15 to the antenna 2. The antenna 2 is for this purpose provided with an input terminal 31. The antenna is further provided with a ground terminal 32 and with matching bridge terminals 33. In this example, four matching bridges 34, 35, 36, 37 are provided, each of which contains a capacitor 3 i.e. 3a, 3b, 3c, and 3d, respectively and a switch 25, i.e. 25a, 25b, 25c, and 25d, respectively, which switch 25 is located outside the antenna device 10. These matching bridges 34, 35, 36, 37 are connected to matching bridge terminals 33. The ground terminal 32 is further connected to the ground conductor. Parallel to said connection between the ground terminal 32 and ground conductor 21, there is a resonant circuit 51 containing a capacitor 52 and an inductor 53.

The antenna device is adapted for Bluetooth applications having a standard frequency of 2.5 GHz and functions as follows. The patch antenna 2 has a length of 10 mm with an inductance of 1 nH/mm. The patch antenna 2 further has a capacitance value of 0.1 pF. If none of the switches 25 in the matching bridges 34–37 are closed, the resulting frequency is 5.0 GHz. The capacitors 3a, 3b, 3c, and 3d have causes capacitance values of 0.1, 0.3, 1.0 and 2.5 pF. Switching-on of an additional capacitance of 0.1 pF causes the frequency to be 3.5 GHz, with an additional capacitance of 0.3 pF the frequency is 2.5 GHz, with 1.3 pF the frequency is 1.3 GHz, and with 3.8 pF the frequency is 0.8 GHz. In this manner the frequency can be adjusted between 0.8 GHz and 5 GHz. Alternatively, the frequency can be tuned to 2.5 GHz if it is found before tuning that the actual frequency deviates from 2.5 GHz. For tuning the frequency downwards, switches have to be turned on; for tuning the frequency upwards, switches have to be turned off. It is therefore preferred to start with one switch on, such that one matching bridge with a capacitor having an intermediate capacitance of 0.3 pF is connected to the ground conductor 21. For example, the switch 25b of matching bridge 35 with a capacitor of 0.3 pF could be turned on. By choosing a suitable combination of switched—on capacitors, other frequencies in between of those mentioned can be realized. The frequency spectrum can be broadened due to the resonant circuit 51. Preferably, the capacitors 3 comply with the NPO-standard, which standard states that the temperature dependence of the capacitance is in the range of −30 to +30 ppm/° C.

Figure 3:
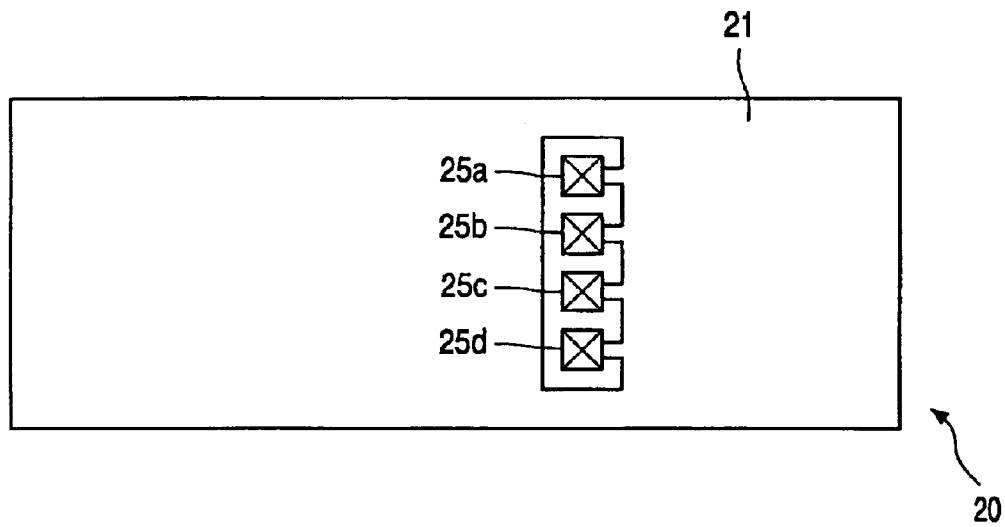
FIG. 3 is a diagrammatic bottom view of the first embodiment of the apparatus.

FIG. 3 is a bottom view of the printed circuit board 20. In this bottom view, the second side 29 of the printed circuit board is shown, provided with the ground conductor 21 and the switches 25a, 25b, 25c, and 25d. In order to disconnect any of the corresponding matching bridges 34, 35, 36, and 37, a switch must be cut through or be destroyed with a laser.

Figure 4:
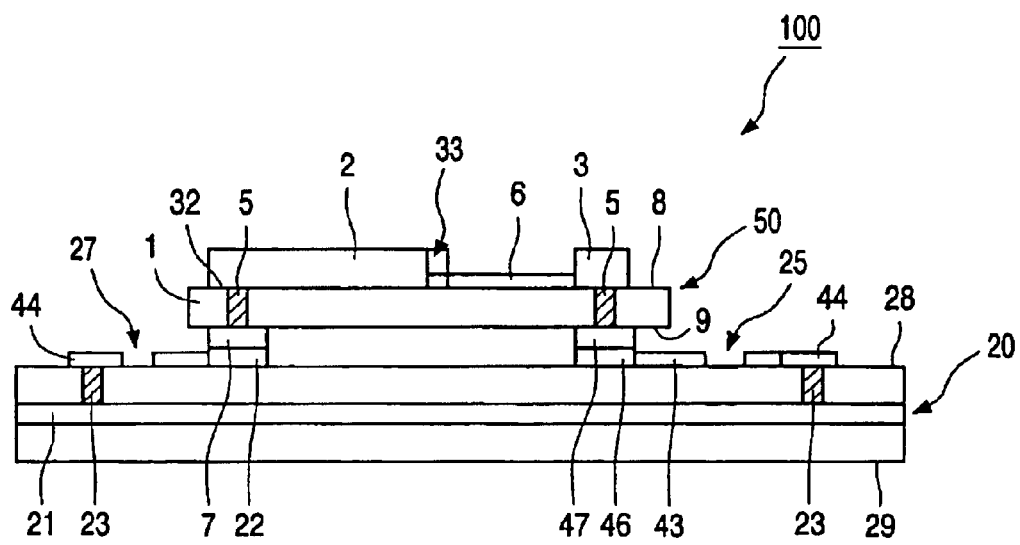
FIG. 4 is a cross-section al view of a second embodiment of the apparatus.

FIG. 4 is a cross-section al view of a second embodiment of the apparatus 100 of the invention. The apparatus 100 comprises a printed circuit board 20 with a first side 28 and a second side 29. The printed circuit board 20 comprises two insulating layers 41,42 between which a ground conductor 21 is provided. At the first side of the printed circuit board, a pattern of conductive tracks is provided, comprising board contact pads 22, 46, interconnects 43, via pads 44, and switches 25, 26, 27, of which in FIG. 4 only switches 25 and 27 are shown. The switches 25,26,27 are embodied as a pair of pads on which an SMD component with a zero or low resistance can be placed to provide a connection. An antenna device 50 is provided on the first side 28 of the printed circuit board 20. The antenna device 50 comprises a substrate 1 with a first side 8 and a second side 9. A patch antenna 2 having an earth terminal 32, a matching bridge terminal 33, and an input terminal 31 (not shown) is provided at the second side. The substrate further contains reactive components 3 and 4 (not shown) and interconnects 6 from the matching bridge terminal 33 to the reactive components 3. Vias 5 are present in the substrate 1.

Figure 5:
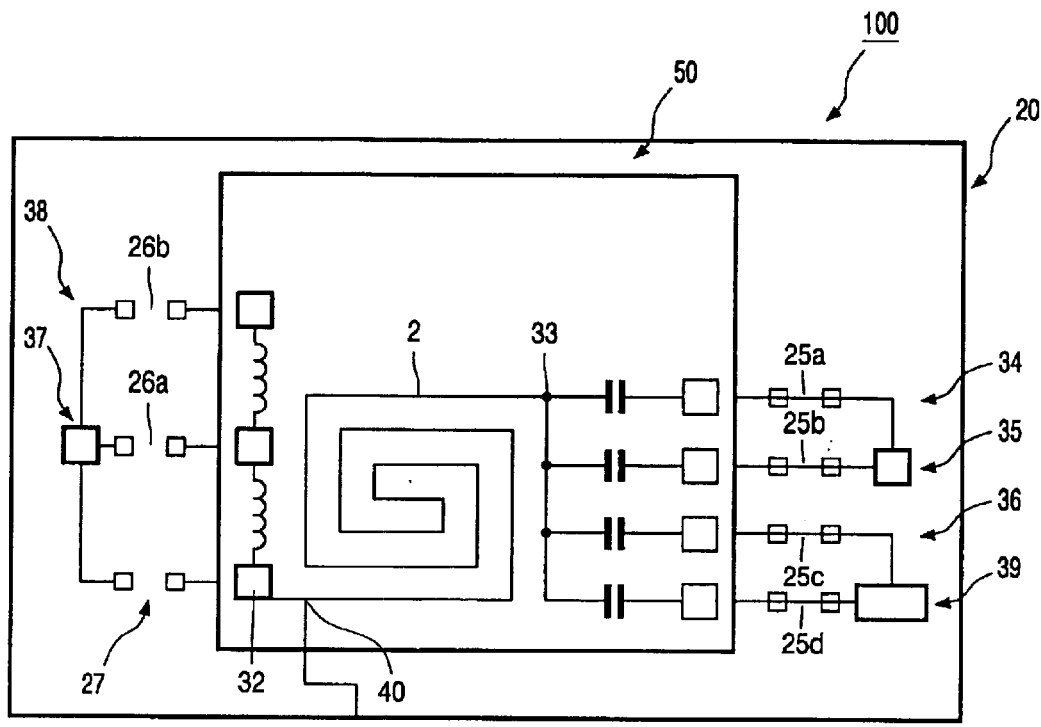
FIG. 5 is a diagrammatic plan view of the second embodiment of the apparatus.

FIG. 5 is a plan view of the second embodiment of the apparatus 100 of the invention. The patch antenna 2 has a spiral shape with the ground terminal 32 at one end and connected thereto the matching bridges 37, 38, and matching bridge terminals 33 at the other end, with matching bridges 34, 35, 36, 39. Also provided is an input terminal 3, through which the antenna 2 communicates with a receiving and transmitting circuit. The reactive components 3, 4 are present on the substrate 1 of the antenna device 50. The switches 25, 26, 27 are present on the first side 28 of the printed circuit board 20. The switches 25,26,27 are embodied as a pair of pads on which an SMD component with a zero or low resistance can be placed to provide a connection.

Figure 6:
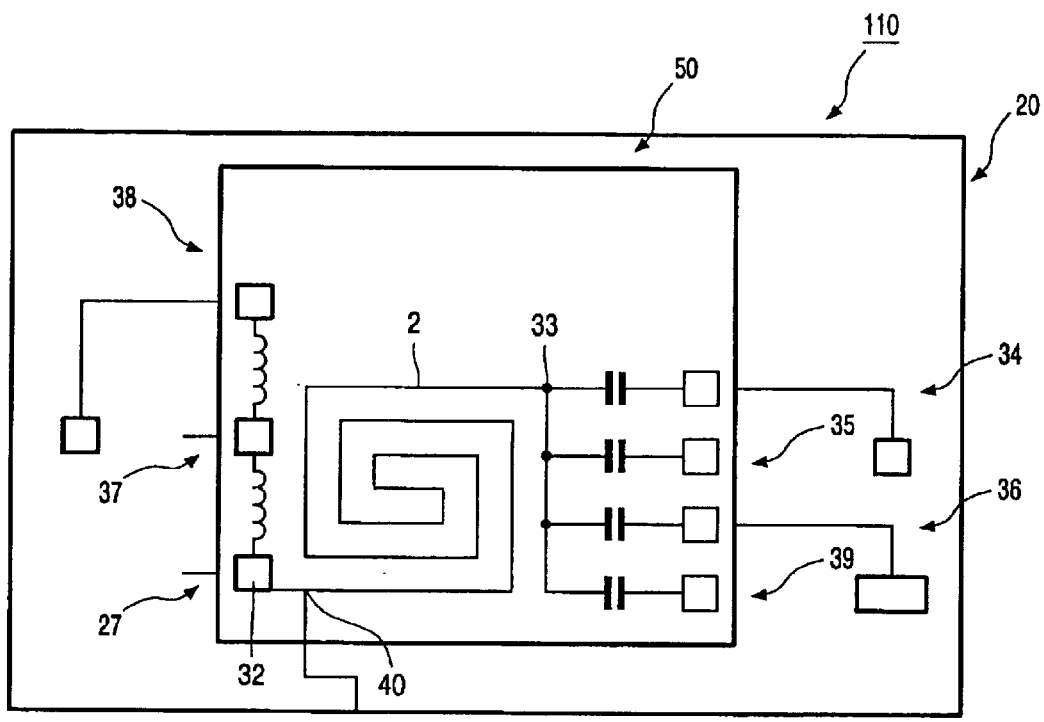
FIG. 6 is a diagrammatic plan view of the apparatus after tuning and redesign.

FIG. 6 is a plan view of the apparatus 110 of the invention. This apparatus 110 results from a redesign of the printed circuit board 20 after tuning of the antenna 2 by means of the matching bridges 34–39. The antenna device 50 has not been changed in this redesign. This has the advantage that the antenna device 50 can be manufactured according to a standardized design. In the apparatus of the invention, the matching bridges 34–39 do not contain switches any more. Instead, some of them, such as the matching bridges 34, 36 and 38, are connected to the ground conductor 21, whereas others are not.

What is claimed is:

1. An apparatus (100) with a radio communication function, comprising a carrier (20) having a first (28) and an opposite, second side (29) and provided with a ground conductor (21), at which first side (28) an antenna device (10,50) is present, which antenna device (10,50) comprises a substrate (1) having a first (8) and an opposite, second side (9) and an antenna (2), present at the first side (8) of the substrate (1) and having an input impedance, the apparatus (100) further comprising means for tuning said input impedance, characterized in that said means comprise a first and a second matching bridge (34, 37) that comprise a reactive component (3,4) and a switch (25, 26), and that are connected between the antenna (2) and the ground conductor (21).

2. An apparatus (100) as claimed in claim 1, characterized in that
   a first module contact pad (7) forming part of the first matching bridge (34) and a second module contact pad (47) forming part of the second matching bridge (37) are present at the second side (9) of the substrate (1); and
   a first board contact pad (22) forming part of the first matching bridge (34) and a second board contact pad (46) forming part of the second matching bridge (37) are present at the first side of the carrier.

3. An apparatus (100) as claimed in claim 2, characterized in that
   the switches (25, 26) of the matching bridges (34, 37) are present on the first side (28) of the carrier (20), and
   the switches (25, 26) are located such that there is no overlap between a perpendicular projection of the antenna device (10,50) onto the carrier (20) and the switches (25, 26).

4. An apparatus (100) as claimed in claim 1, characterized in that the reactive components (3) of the first and the second matching bridges (34, 35) are capacitors.

5. An apparatus (100) as claimed in claim 1, characterized that a resonant circuit (51) is present between the antenna (2) and the ground conductor (21).

6. An apparatus (100) as claimed in claim 2, characterized in that the reactive components (3,4) are present in the antenna device.

7. An apparatus (100) as claimed in claim 6, characterized in that the reactive components (3,4) are present on the substrate (1) and are integrated into an array of passive components.

8. An apparatus (100) as claimed in claim 1, characterized in that the antenna device (10) comprises an integrated circuit (11) and a filter (12,13,15,17).

9. An apparatus (110) with a radio communication function, comprising a carrier (20) with a first (28) and an opposite, second side (29) and provided with a ground conductor (21), at which first side (28) an antenna device (10,50) is present, which antenna device (10,50) comprises a substrate (1) having a first (8) and an opposite, second side (9) and an antenna (2) present at the first side (8) of the substrate (1) and having an input impedance, the apparatus (110) further including means for tuning said input impedance, wherein said means comprise a first and a second matching bridge (34,37). that are electrically connected to the antenna (2) and are provided with a reactive component (3,4), and at least one of said bridges (34,37) is electrically connected to the ground conductor (21).

10. An antenna device (10,50) suitable for use in the apparatus (100, 110) as claimed in claim 1, comprising
    a substrate (1) having a first (8) and an opposite, second side (9)
    an antenna (2) present at the first side (8) of the substrate (1), and
    antenna device parts belonging to a first and a second matching bridge (34,37), that are connected to the antenna (2) and is provided with a reactive component (3,4).

11. A carrier (20) suitable for use in the apparatus (100) as claimed in claim 2, having a first (28) and an opposite, second side (29) and provided with a ground conductor (21), at which first side (28) a first (22) and a second board contact pad (46) are present, which first (22) and second contact pads (46) are connected to the ground conductor (21) via a first and a second switch (25,26), respectively.

12. A method of tuning an antenna (2) of an apparatus (100) with a radio communication function, which apparatus (100) comprises:
    a carrier (20) with a ground conductor (21),
    an antenna device (10,50) comprising a substrate (1) and the antenna (2), and
    a first and a second matching bridge (34,37) between at least one point (32,33) on the antenna (2) and at least one point on the ground conductor (21), each of said matching bridges (34,37) comprising a reactive component (3,4) and a switch (25,26)
  which method comprises the steps of:
  measuring an input impedance of the antenna (2); and
  adapting the input impedance of the antenna (2) by switching at least one of said switches (25,26) on or off.

* * * * *